United States Patent [19]

Voss et al.

[11] Patent Number: 4,874,930
[45] Date of Patent: Oct. 17, 1989

[54] ELECTROCONDUCTIVE FILM SYSTEM FOR AIRCRAFT WINDOWS

[75] Inventors: David L. Voss, Van Nuys; Howard S. DeCamp, Northridge; Gordon W. Culp, Van Nuys, all of Calif.

[73] Assignee: Sierracin Corporation, Sylmar, Calif.

[21] Appl. No.: 85,123

[22] Filed: Aug. 13, 1987

Related U.S. Application Data

[63] Continuation of Ser. No. 529,975, Sep. 7, 1983, Pat. No. 4,707,586, which is a continuation-in-part of Ser. No. 262,494, May 11, 1981.

[51] Int. Cl.⁴ .............................................. H05B 3/06
[52] U.S. Cl. .................................. 219/522; 219/203; 428/46; 427/108
[58] Field of Search ............... 219/522, 203, 345, 461, 219/541, 543, 544; 338/211, 217, 309, 322; 174/68.5; 428/46, 49; 427/108, 103

[56] References Cited

U.S. PATENT DOCUMENTS

| | | | |
|---|---|---|---|
| Re. 28,042 | 6/1974 | Rhodenizer et al. | 204/38 B |
| 1,855,507 | 4/1932 | Bathrick | 219/461 |
| 1,954,128 | 4/1934 | Heyroth et al. | 219/461 |
| 2,624,823 | 1/1953 | Lytle | 219/543 X |
| 2,813,960 | 11/1957 | Egle et al. | 219/544 X |
| 2,932,710 | 4/1960 | Coale et al. | 219/544 X |
| 3,245,023 | 4/1966 | Schmidt | 338/311 |
| 3,288,983 | 11/1966 | Lear, Sr. | 219/203 X |
| 3,440,408 | 4/1969 | Brittan | 219/522 |
| 3,475,595 | 10/1969 | Leclerq | 219/522 |
| 3,484,583 | 12/1969 | Shaw, Jr. | 219/522 |
| 3,601,583 | 8/1971 | Fujiwara | 219/522 |
| 3,612,745 | 10/1971 | Warren | 174/68.5 |
| 3,659,079 | 4/1972 | Whittemore | 219/522 |
| 3,729,616 | 4/1973 | Gruss et al. | 219/522 |
| 3,790,752 | 2/1974 | Boaz et al. | 219/552 |
| 3,792,232 | 2/1974 | Zarenko | 219/522 |
| 3,801,418 | 4/1974 | Cornelis et al. | 428/922 X |
| 3,802,907 | 4/1974 | Apfelbach et al. | 219/528 X |
| 3,813,519 | 5/1974 | Jochim et al. | 219/522 |
| 3,832,176 | 8/1974 | Verstraete et al. | 96/67 |
| 3,931,496 | 1/1976 | Hurko | 219/543 |
| 3,947,618 | 3/1976 | Gruss | 428/49 |
| 4,029,942 | 6/1977 | Levin | 219/552 |
| 4,078,107 | 3/1978 | Bitterice et al. | 428/38 |
| 4,109,044 | 8/1978 | Marriott | 428/210 |
| 4,242,413 | 12/1983 | Iwahashi et al. | 428/412 |
| 4,323,726 | 4/1962 | Criss et al. | 174/68.5 |
| 4,353,952 | 10/1982 | Brown et al. | 428/201 |
| 4,395,459 | 7/1983 | Herschdorfer et al. | 428/391 |

FOREIGN PATENT DOCUMENTS

1371852 10/1974 United Kingdom.
2088412 6/1982 United Kingdom.

*Primary Examiner*—E. A. Goldberg
*Assistant Examiner*—M. Lateef
*Attorney, Agent, or Firm*—Christie, Parker & Hale

[57] ABSTRACT

A method is provided for producing a heated laminated windshield construction. Initially, a transparent material to be provided as the outer layer of such a laminated windshield is selected. A transparent basecoat is applied on the inner major surface of the outer layer. A quantity of electroconductive metal is deposited onto the basecoated surface to form a metal strike coat. A portion of the metal strike coat is masked so that unmasked portions of the strike coat comprise the pattern of the electroconductive metal film runs to be formed on the inner major surface. An electroconductive metal is electroplated onto the unmasked portions of the strike coat. Portions of the strike coat onto which no metal was electroplated are removed to thereby leave on the inner major surface of the layer a plurality of spaced apart electroconductive metal film runs comprising electroplated metal and the portion of the metal strike coat beneath the electroplated metal. A major surface of a transparent material is then bonded to the inner surface of the outer layer to thereby sandwich the space apart electroconductive metal film runs between the layers.

7 Claims, 5 Drawing Sheets

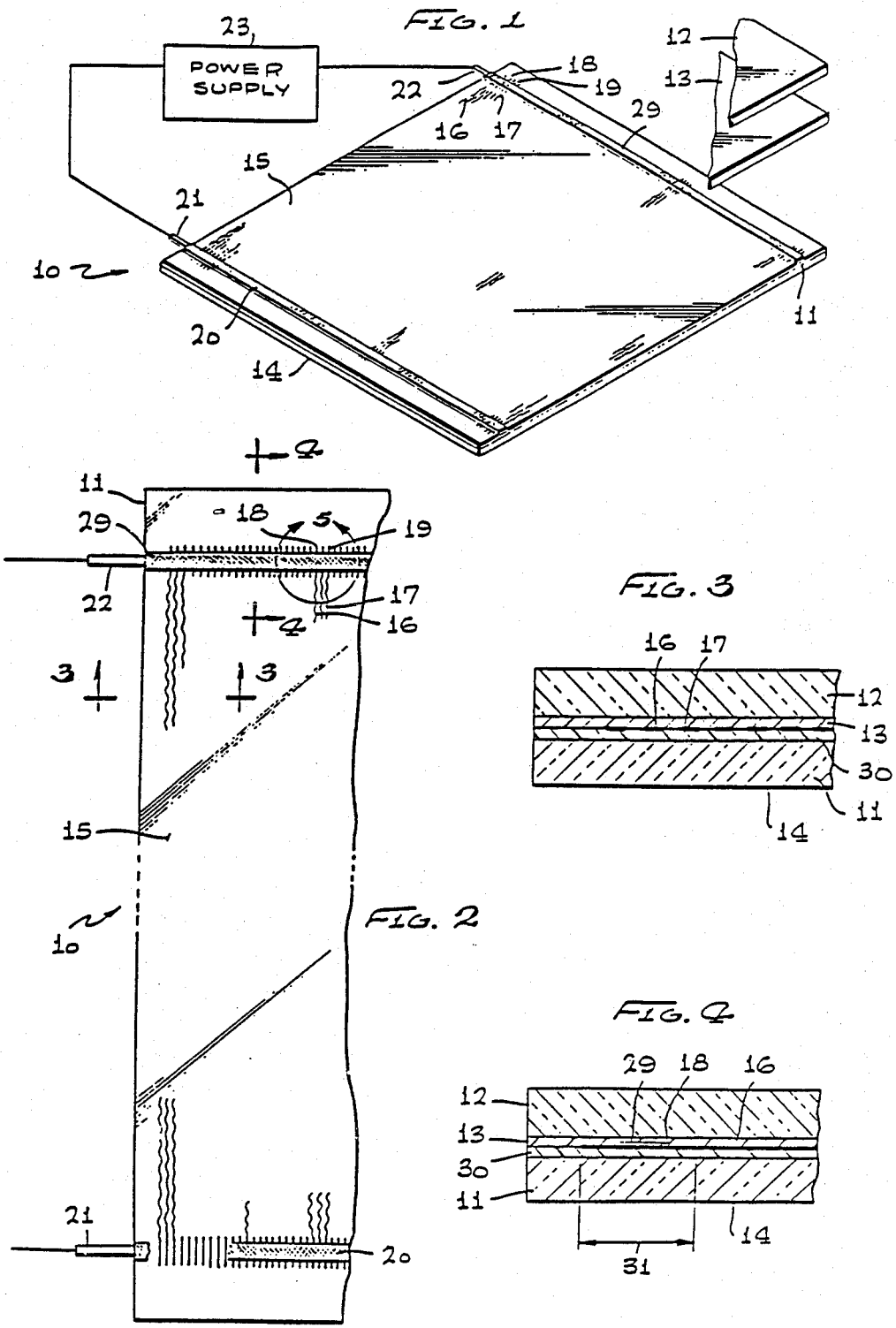

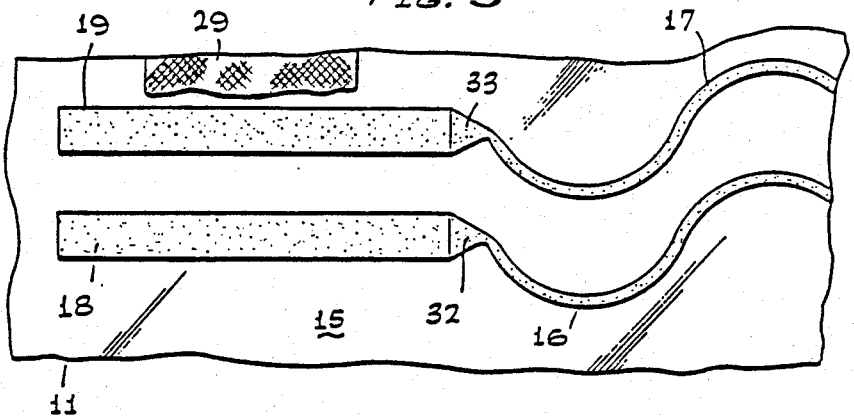
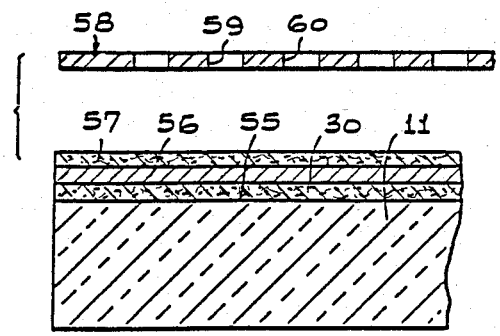
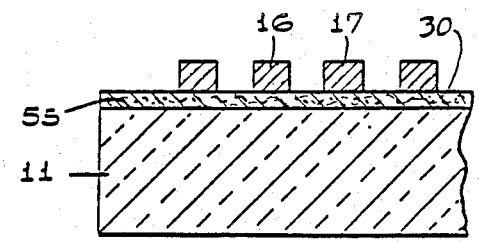
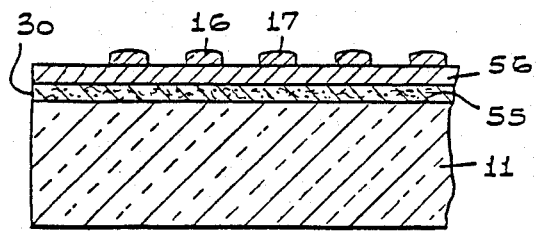
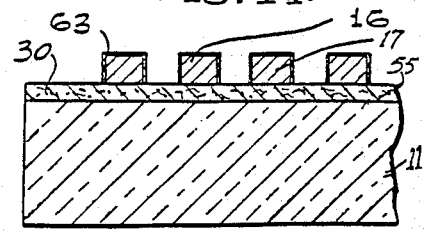

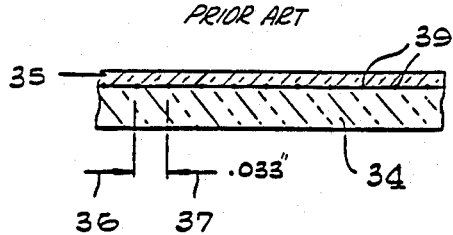
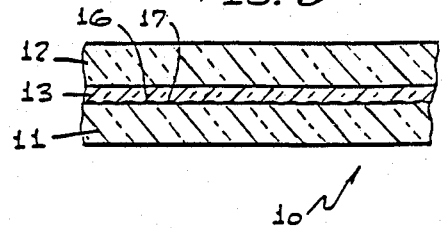
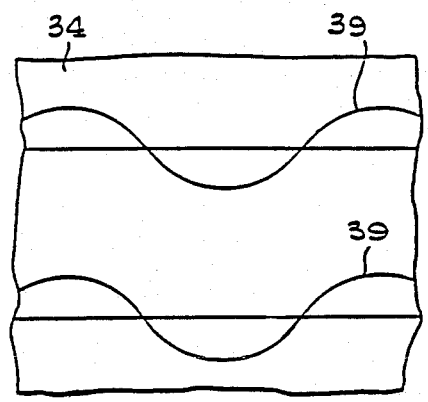
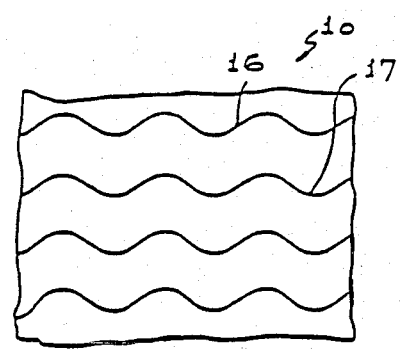
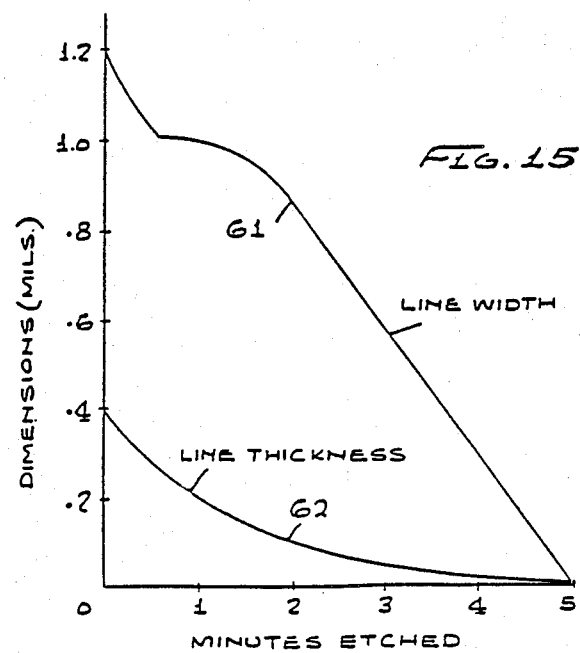

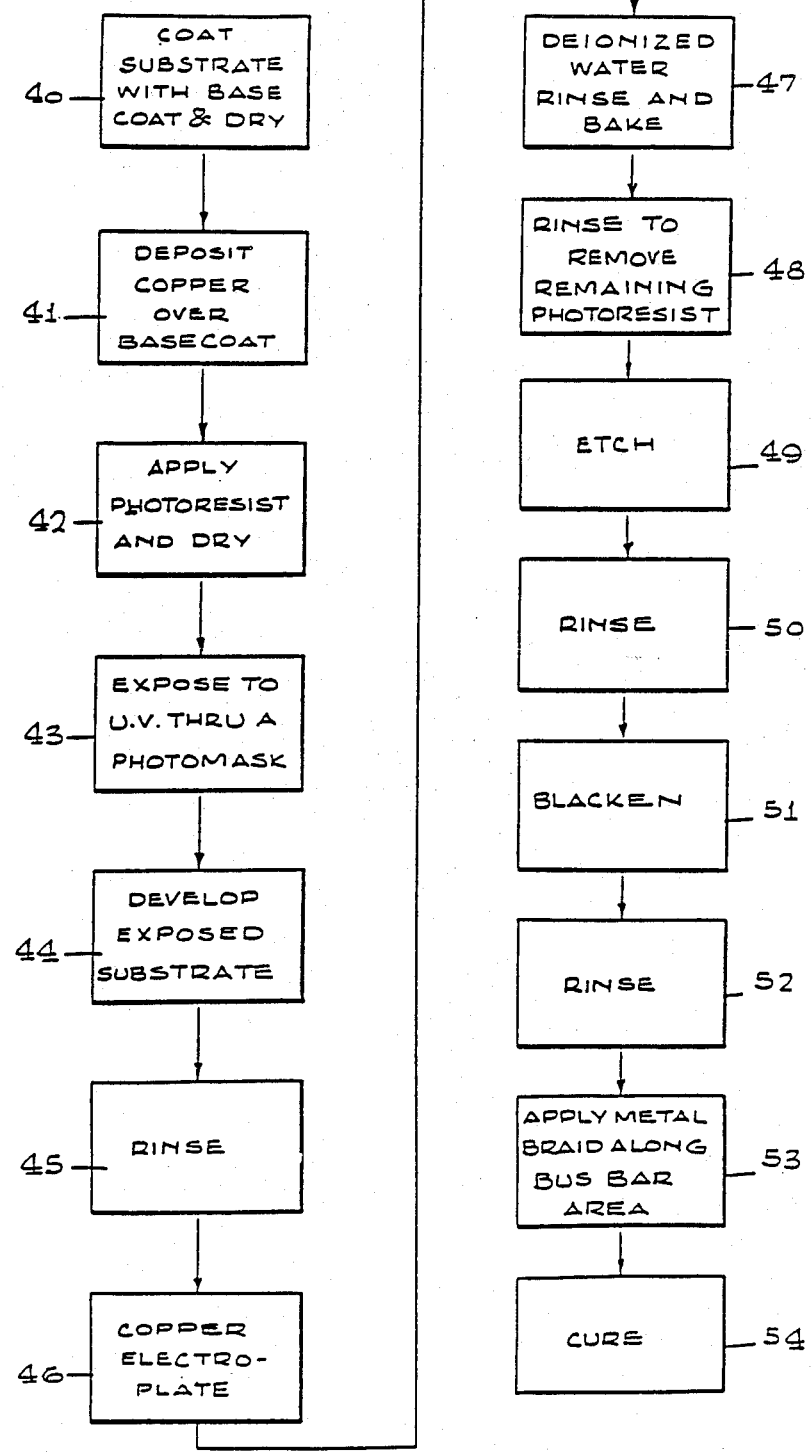

ELECTROCONDUCTIVE FILM SYSTEM FOR AIRCRAFT WINDOWS

CROSS-REFERENCE TO RELATED APPLICATION

This application is a continuation of application Ser. No. 529,975, filed Sept. 7, 1983, now U.S. Pat. No. 4,707,586, which is a continuation-in-part of application Ser. No. 262,494, filed May 11, 1981, which is incorporated herein by this reference.

FIELD OF THE INVENTION

The present invention relates to methods for forming electroconductive systems suitable for combination with laminated layered constructions so as to be useful in providing anti-static devices and heating circuits for aircraft windshields or the like.

BACKGROUND OF THE INVENTION

In the past, various laminated windshields (windows) have been provided for aircraft. Such laminations can be made of rigid layers of glass or plastic or combinations of glass and plastic sandwiched together by means of interlayers such as urethane, polyvinyl butyral or silicone.

Commonly the windshields are provided with electrical systems or circuits that are bonded between the layers and that heat the windshield when energized.

One type of electrical system provided in the past for heating includes a thin film of conductive metal or metal oxide adhered on the inner surface of a rigid outer windshield layer or face ply.

There are disadvantages, however, to using such conductive films. For example, such films can be less transparent than desired, thus impairing vision. The films have been found to be particularly undesirable for use with low voltage systems, e.g., 28 volt systems found in small aircraft and helicopters. For example, if the films are made thick enough so that they conduct enough current for proper heating, they are far less transparent than desired.

Another type of electrical system used in such windows/windshields for heating is based on using a circuit of wires embedded between layers in the laminate. Generally the wires are hot pressed below the surface of the interlayer adjacent the face ply. Since it is desired not to impair vision through the windshield, fine wires, e.g., wires having a diameter of 0.5 to 1.5 mils, are used and the wires are spaced apart in a geometric pattern.

There are, however, disadvantages to using such small diameter wire. For example, such wires break easily during the manufacturing process causing process inefficiencies and rejects. Also images viewed through the heater zone of a typical wire heated windshield can appear blurred and distorted. Such distortion is caused by the thermal gradient created in the interlayer around and between wires which, in turn, results in gradients in indices of refraction. Such thermal gradients are the result of the wire having, at most, only tangential contact with the face ply being heated while being surrounded by interlayer material which is a poor heat conductor. When the heater is energized the interlayer becomes very hot at the wire surface which causes the steep thermal gradient and resulting optical distortion.

Another approach to providing a heater circuit on the surface of a glass panel in a window laminate is disclosed by Coale, et al. in U.S. Pat. No. 2,932,710. The electrical conductors disclosed by Coale, et al. are applied to the glass surface by first masking the surface completely with a protective film. The pattern of the electrical conductors is then formed through the film by scribing or using photographic techniques to thereby expose only that portion of the glass that forms the desired conductor pattern. A metal such as silver or copper or gold is then applied by "conventional mirror-producing methods" or by vaporization to the exposed pattern on the glass surface. The protective film is then removed from remaining portions of the glass leaving the conductive metal lines on the glass surface.

When a circuit that comprises electroconductive lines is provided on a glass surface for heating a windshield that incorporates the circuit, it is important that the lines adhere to the surface. For example, if such lines do not adhere, non-uniform heating can result which can distort vision through the windshield. Such vision distortion can be intolerable, for example, in aircraft windshields.

Although the disclosure of Coale, et al. relates to forming electroconductive lines on glass, aircraft windshields onto which such lines can be formed for use as a heater may be made entirely of plastic as a weight-saving measure.

There is a need in the art, therefore, for a simple and economical process for forming electroconductive lines comprising thin films of metal onto the surface of a glass and/or a plastic substrate where adherence of the lines to the substrate is enhanced.

SUMMARY OF THE INVENTION

A method is provided for forming a plurality of spaced apart electroconductive metal film runs on the surface of a transparent substrate. The substrate can be either glass or plastic and is to be incorporated as the outer or first layer of a heatable window. The substrate or layer has an outer major surface for exposure to the atmosphere and an inner major surface which carries the electroconductive metal film runs. The inner surface is bonded facewise to a second layer of transparent material, for example, a layer of polyvinyl butyl, urethane or silicone. Thus, the metal film runs are sandwiched between the layers.

The method includes selecting a transparent material to be provided as the first or outer layer of the heatable window. Next, a major surface of the first layer that is to be provided as the inner major surface is selected and a transparent basecoat is applied on the selected surface. A quantity of electroconductive metal is deposited onto the basecoated surface to thereby form a metal strike coat. In one embodiment, before depositing the metal strike coat onto the surface, a metal tie-coat is first deposited on the basecoat and the metal strike coat is deposited on the tie-coat.

A portion of the metal strike coat is masked so that unmasked portions of the strike coat comprise the pattern of the electroconductive metal film runs to be formed. An electroconductive metal is electroplated onto the unmasked portions of the strike coat. Portions of the strike coat onto which no metal was electroplated are then removed to thereby leave on the inner major surface of the first layer a plurality of spaced apart electroconductive metal film runs. The electroconductive metal film runs comprise electroplated metal and the portion of the metal strike coat beneath the electroplated metal. When a tie-coat is also used, the electroconductive metal film runs comprise electroplated metal, the portion of the metal strike coat beneath the electroplated metal, and the portion of the tie-coat beneath the strike coat.

After the electroconductive film runs are on the inner major surface of the first layer, a major surface of a transparent material selected as the second layer is then bonded to the inner surface of the first layer. Thus, the spaced apart electroconductive metal film runs are sandwiched between the first and second layers. Additional layers can be provided to complete the laminated construction.

BRIEF DESCRIPTION OF THE DRAWINGS

These and other features, aspects and advantages of the present invention will be more fully understood when considered with respect to the following detailed description, appended claims, and accompanying drawings, wherein:

FIG. 1 is a semi-schematic exploded perspective view of a typical aircraft window incorporating the novel electroconductive system provided in accordance with practice of principles of this invention;

FIG. 2 is an enlarged semi-schematic view of the aircraft window shown in FIG. 1 illustrating the sinusoidal electroconductive medium pattern extending between bus strips or bars;

FIG. 3 is a semi-schematic transverse cross sectional view of the window taken in the direction of arrows 3—3 of FIG. 2;

FIG. 4 is a semi-schematic cross sectional view of the window taken in the direction of arrows 4—4 of FIG. 2;

FIG. 5 is a semi-schematic enlarged plan view of the electroconductive medium runs terminating in an attachment element as taken within the circle 5 indicated on FIG. 2;

FIGS. 6 and 7 illustrate prior aircraft windows employing wire runs in a conventional pattern;

FIGS. 8 and 9 are semi-schematic cross sectional and plan views respectively illustrating a novel sinusoidal pattern and spacing of electroconductive medium runs provided in accordance with practice of this invention;

FIG. 10 is a block diagram showing the successive process steps provided in accordance with practice of this invention for producing a novel aircraft window;

FIGS. 11, 12, 13 and 14 are semi-schematic cross sectional views of an aircraft window at various stages in its formation according to the process outlined in the block diagram of FIG. 10; and FIG. 15 is a graph schematically illustrating reduction of electroconductive medium height and width during an etching step provided in accordance with practice of the process of this invention.

DETAILED DESCRIPTION

Figure 16:
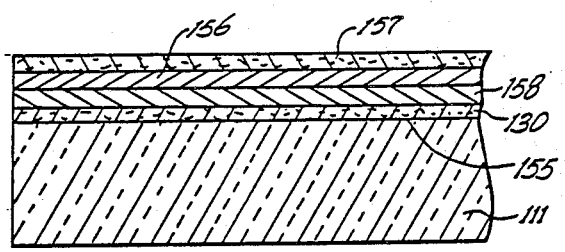
FIG. 16 is a semi-schematic cross sectional view of an aircraft window being formed in accordance with practice of this invention showing a strike coat, tie-coat and basecoat.

Referring to FIG. 1, a novel window or windshield 10 provided in accordance with practice of principles of this invention comprises a rigid outer layer 11, a rigid inner layer 12, and an intermediate flexible layer 13. In one form of the invention, the rigid outer and inner layers may be composed of glass or of plastic while the intermediate or inter layer may be composed of polyvinyl butyral or silicone or urethane composition. The outer layer 11 has an outer or exterior major surface 14 and an inner major surface 15. The major surfaces 14 and 15 are on opposed sides of the layer 11. The inner major surface 15 carries a plurality of electroconductive metal runs, e.g., copper or nickel or the like that comprise an electroconductive circuit. The electroconductive runs, such as the runs 16 and 17, are arranged in fixed spaced apart relationship preferably in a sinusoidal pattern on the surface 15.

As is described below in greater detail, the opposite ends of each of the respective electroconductive metal runs on the surface 15 terminate in attachment elements that are carried along the edge marginal region of the layer 11. For example, one end of the electroconductive metal run 16 is integral and terminates with the attachment element 18 and one end of the electroconductive metal run 17 is integral and terminates with the attachment element 19. Similar attachment elements are also on the opposite ends of the runs 16 and 17. Wire braid bus strips or bars 20 and 29 extend transversely across the respective attachment elements and are suitably secured thereto by an adhesive such as silver epoxy resin or solder. Selected ends of the bus bar are suitably attached to terminal leads or connections 21 and 22 so that the attachment can be made to a suitable power source 23.

In the past, high voltage power sources, i.e., sources of greater than about 100 volts were normally used in aircraft and thus, prior art aircraft window or windshield heating systems were designed to operate at such high voltages. The heating system provided in accordance with practice of principles of this invention, however, is useful both with high voltage systems and also with low voltage systems such as 28 volt systems used commonly on lightweight aircraft and helicopters.

Referring now in detail to FIG. 2, the plurality of electroconductive metal runs 16 and 17 are shown on the surface 15 of the aircraft window 10. Each of such runs comprises a thin metal film applied to the surface 15 in accordance with practice of principles of the process of this invention. Each of the thin film runs is elongated and together they form a sinusoidal pattern. The amplitude of the sinewaves provided in accordance with this invention is less than the amplitude of sinewaves formed by prior art sinusoidal patterns of wire. Furthermore, the film runs are more closely spaced apart from each other than wires used in prior art heater applications.

With respect to the terminating ends of each of the film runs, it can be seen that attachment elements, such as the elements 18 and 19, are provided which serve as attachment or connecting locations for the bus bar 29. Similar attachment elements serve as attachment or connecting locations for the bus bar 20. Preferably, the bus bars are composed of a tin-plated copper braid and are adhesively secured to the attachment elements on both ends of each such thin film run by means of soldering or a suitable adhesive such as silver epoxy resin. The terminals or leads 21 and 22 are suitably attached to the extreme end of the braids or bus bars 20 and 29, respectively, by any suitable means so that a proper mechanical and electrical connection is produced.

Referring now in detail to FIG. 3, a sectional view of the window 10 is illustrated. As was mentioned previously, the window 10 is laminated into a unitary construction having an outer layer 11 and an inner layer 12 both of a rigid material such as glass or plastic, for example. The intermediate or interlayer 13, which is bonded between the layers 11 and 12, is more flexible than the layers 11 and 12 and is made of polyvinyl butyral, urethane or silicone, for example. The plurality of electroconductive metal runs such as the thin film runs illustrated by numerals 16 and 17 comprise a conductive metal such as copper or nickel or the like and are arranged in fixed spaced apart parallel relationship on top of a polymeric basecoat (described in greater detail below) which is extremely thin and is identified by numeral 30.

Referring to FIG. 4, each of the runs of electroconductive medium such as the thin film run 16 terminates in the attachment element 18 forming a contact location for engagement and securement with the bus bar braid 29. The attachment element length is extended between the dimensions of the line 31. The height of the attachment element and the height of each of the thin film runs or strips is identical and each is carried on the basecoat 30 and covered by the flexible intermediate or interlayer 13.

With reference to FIG. 5, there is shown a greatly enlarged view of the attachment elements 18 and 19 associated with thin film runs 16 and 17 respectively. It is to be particularly noted that the juncture of the terminating ends of each of the thin film runs is of a small area or width as compared to the attachment element width. A feature of the present invention includes the provision of a tapered thickened portion, such as portions 32 and 33, associated with runs 16 and 17 respectively. Experimentation has indicated that directly connecting the relatively small area or narrow width of the end of the run with the relatively wide and larger area of a respective attachment element causes processing difficulties at this juncture which can destroy the usefulness of the conductor. Therefore, a feature of the present invention involves the provision of an enlarged thickened portion of each such electroconductive metal run which has a taper that is wider at the attachment element and narrower more remote from the attachment element. In this manner, connection or juncture is successfully achieved without encountering "hot spots" or undesirable burnout conditions.

Referring to FIGS. 6 and 7, a conventional aircraft window known in the art is illustrated having an outer layer 34 and an inner layer 35 separated by a heater element which comprises a plurality of runs composed of wires 39 which have been hot pressed into the surface of the layer 34. The layer 34 is laminated to the opposing surface of the layer 35. The wire runs are relatively wide apart as indicated by the dimensions between arrows 36 and 37. The separation between adjacent runs is indicated in FIG. 7 as well and it can be seen that the plurality of runs form a sinusoidal pattern which is of relatively high amplitude approximately 0.017 inches in height. The dimension between parallel wire runs is approximately 0.033 inches and one cycle or sinewave of the pattern is approximately 0.060 inches.

Referring particularly to FIGS. 8 and 9 which show an exemplary embodiment of a window 10 provided in accordance with practice of this invention, it can be seen that the film runs are arranged in a sinusoidal pattern which is closer together and of lesser amplitude than that normally used in the typical or conventional sinusoidal pattern as showv in FIGS. 6 and 7. In the present inventive pattern, which may be any random or geometric pattern, the distance between adjacent runs is approximately 0.010 inches and a single sinewave is approximately 0.018 inches in length while the amplitude is 0.0035 inches. The dimensions noted herein are exemplary. Because of the applicant's use of thin metal film runs and the unique process provided in accordance with this invention for forming the array or pattern of such runs, improved optical characteristics are achieved since distortion is minimized. For example, when power is supplied to the conventional sinewave pattern described in FIGS. 6 and 7, severe light diffraction is observed when viewing point light sources such as, for example, runway lights for night landing. Such diffraction is not observed when the film runs are provided in accordance with this invention in a pattern such as the pattern illustrated in FIGS. 8 and 9.

The process provided in accordance with practice of this invention for forming the plurality of thin electroconductive metal film runs and attachment elements on the surface of a transparent substrate that is to be used as one layer of a heatable laminated window or windshield can be understood by referring to FIGS. 10–15.

Initially, a transparent material such as glass or plastic, e.g., acrylic, is selected to be provided as the outer layer of the heatable laminated window. A surface of the selected outer layer, hereinafter referred to as the "inner major suface", is selected for carrying the electroconductive film runs.

Referring first to FIG. 10, the process provided in accordance with this invention for forming the electroconductive metal runs is set forth in a plurality of successive steps identified by the reference numerals 40–54.

The first step (identified by numeral 40 in FIG. 10) relates to the application of a transparent organic basecoat to the inner major surface of the selected material or substrate. When the substrate is acrylic, the basecoat preferably comprises a co-polymer reaction product of a methacrylic acid ester, e.g., methylmethacrylate, and an organofunctional silane, e.g., methacryloxypropyltrimethoxy silane supplied by Union Carbide Co. and identified as "A174". The organofunctional silane has the general formula $R—Si(OR')_3$ wherein R comprises the acrylic containing organofunctional group and R' is an alkyl group, e.g., $CH_3$, $—CH_2CH_3$, etc. In an exemplary embodiment, the basecoat is produced by first polymerizing about equal weights of the monomers in a chlorinated solvent such as ethylene dichloride to about 20% solids using a free radical initiator such as 2.2'—azobisisobutylnitrile. In one embodiment a mixture comprising about 470 grams of methylmethacrylate monomer, 470 grams of methacryloxypropyltrimethoxy silane and 2.2 grams of 2.2'—azobisisobutylnitrile (AIBN) is added dropwise to 1500 milliliters (ml) of ethylene dichloride refluxing at about 180°–185° F. The mixture is stirred for about 2 hours and thereafter about 1.1 grams of AIBN in 500 ml of ethylene dichloride is added dropwise followed by the addition of 1000 ml of ethylene dichloride. The basecoat, which at this intermediate stage in its preparation comprises 20% solids is then diluted to about 5% solids in a solvent mixture comprising about 90% toluene and 10% ethyl acetate. In an exemplary embodiment, 900 grams of the 20% solids basecoat solution, 2430 grams of toluene, 270 grams of ethyl acetate and 18 grams of methacryloxypropyltrimethoxy silane are mixed together to form the final basecoat formulation.

The basecoat is applied to the inner major surface of the acrylic substrate by flow coating and is then cured to form an adherent bond between it and the substrate surface. To provide for the cure the substrate is air dried for about 15–30 minutes and is then immersed in a weak acid solution, e.g., 10% $H_2SO_4$, for about 1-4 hours. The substrate is then rinsed with water and dried.

When the substrate is glass, the transparent organic basecoat preferably comprises a composition that includes a urea-formaldehyde compound, e.g., a material identified by American Cyanamide Co. as "Beetle 227-8", an epoxy resin, e.g., a material identified by Shell Co. as "EPON 1007", and an organofunctional silane, e.g., a material identified by Union Carbide Co. as "A1100" which comprises gamma-aminopropyltriethoxy silane. The urea formaldehyde, epoxy resin and silane are diluted to about 4% solids in a solvent mixture comprising about equal parts of toluene, xylene, methylisobutyl carbinol and methylisobutyl ketone. One part of this diluted mixture is then added to six parts butyl cellosolve to provide the completed basecoat formulation. This basecoat is preferably flowcoated onto the inner major surface of the glass substrate and is then air dried for about 20-30 minutes, followed by heating at about 300° F. for about 1-6 hours to complete the cure.

The basecoats provided in accordance with the invention adhere vigorously to their respective substrates. Further, such basecoats enhance the adherence of the electroconductive metal runs provided in accordance with the process of this invention on such a substrate. When it is stated herein that the electroconductive metal runs are "on a substrate" it is meant that they are on a basecoat previously applied to the substrate.

After the basecoat is cured, a quantity of an electroconductive metal, e.g., nickel or copper, is deposited onto the basecoated surface to form a metal strike coat. In an exemplary embodiment copper is deposited onto the basecoat by vacuum evaporation techniques. Such a copper strike coat preferably has a uniform thickness of from about 1000 Angstroms to about 3000 Angstroms and, as is described below in greater detail, provides a surface onto which metal comprising the electroconductive film runs is deposited using electrodeposition techniques.

Although the metal strike coat adheres well to both the glass and plastic substrates by means of the basecoat previously applied thereto, if desired, a metal tie-coat can be applied to the basecoat prior to application of the strike coat. It has been found, for example, that a tie-coat comprising nickel and chromium adheres more vigorously to the basecoat than does a copper strike coat when applied directly on the basecoat.

In an exemplary embodiment of using such a tie-coat for enhanced adhesion, an alloy comprising 80% nickel-20% chromium identified by MSW Company of Westlake Village, California as "TOPHET A" is vacuum deposited onto the basecoat. Preferably, the thickness of the tie-coat is about 300 Angstroms. After the tie-coat is in the substrate the metal strike coat is vacuum deposited onto the tie-coat.

Although the tie-coat of the exemplary embodiment comprises about 80% nickel and 20% chromium, tie-coats that include other percentages of nickel and chromium can be used. Additionally, it is thought that other metals such as titanium and the like can be used as tie-coats.

A copper strike coat of at least about 1000 Angstroms thick has been found to provide a high enough conductance to minimize the IR drop between bus bars to an acceptable level. When the copper strike coat is greater than about 3000 Angstroms thick an undesirable level of stress can be built up in the strike coat. Such stress can result in lack of adhesion of the strike coat to the basecoat or to the tie-coat when such a tie-coat is used. Thus, preferably, the strike coat has a thickness between about 1000 Angstroms and about 3000 Angstroms.

The step of applying the strike coat onto the basecoat or alternatively applying the tie-coat and then the strike coat onto the basecoat is identified by numeral 41 of FIG. 10.

Next, (as is identified by numeral 42 of FIG. 10) a photoresist such as the positive photoresist identified as "AZ1450J" by Shipley Company, Inc. of Newton, Massachusetts is applied by dipping, spraying or flowcoating procedures onto the substrate over the strike coat. The photoresist is then air dried for about 5 minutes and then is baked for about 30 minutes at 175° F.

Following baking, a patterned photo mask, suitably fabricated from MYLAR or glass, is removably applied over the photoresist coating. The cut-out portion of the photo mask pattern comprises the pattern of the electroconductive metal film runs being formed. Preferably, intimate contact is maintained between the photomask and the photoresist by vacuum techniques while portions of the photoresist left uncovered by the pattern are exposed to ultraviolet light. (The photoresist exposure step is identified by numeral 43 of FIG. 10.)

Next, (as identified by numeral 44 of FIG. 10) the exposed substrate is developed in a conventional developer, e.g., a developer comprising an aqueous solution of potassium hydroxide. In an exemplary embodiment, 7 grams of potassium hydroxide per liter of water is used as a developer and the substrate is exposed to this solution for about 1 minute. The developer removes those portions of the photoresist that were exposed to the ultraviolet light. Upon removal of the exposed photoresist, a portion of the metal strike coat remains masked by unexposed photoresist and the unmasked portions of the strike coat comprise the pattern of the electroconductive film runs being formed.

Although the above-described photoresist is a "positive" photoresist, if desired, a "negative" photoresist can be used and the above-mentioned steps can be modified accordingly.

Next, (as identified by the numeral 45 of FIG. 10) the developed and partly exposed substrate is rinsed, preferably with de-ionized water, for about 1 minute.

After the rinse step, an electroplating step (identified by the numeral 46 of FIG. 10) is conducted. During the electroplating step an electroconductive metal is electrodeposited onto the unmasked portions of the metal strike coat. In an exemplary embodiment, the rinsed substrate is electroplated with copper in an acid copper sulfate bath that comprises about 200 grams per liter of copper sulfate, 12 grams per liter aluminum potassium sulfate, and 56 grams per liter of 1.84 specific gravity sulfuric acid. The electroplating is continued for about 30 minutes preferably at a current density of about 2.0 amps per square foot.

After the electrodeposition step the substrate is oven baked for about 1 hour at about 175° F. after a deionized water rinse. These steps are identified by the numeral 47 of FIG. 10.

Next, the substrate (as indicated by the numeral 48 of FIG. 10) is immersed for 3-5 minutes in a resist remover such as that identified as "1112A" supplied by Shipley Company, Inc. to thereby remove remaining photoresist.

After the remaining photoresist is removed, the substrate is placed into an etching solution to remove portions of the metal strike coat onto which no metal was electroplated. Removal of the metal strike coat isolates the plurality of spaced apart electroconductive metal film runs on the surface of the substrate. Such metal film runs comprise electroplated metal and that portion of the metal strike coat beneath the electroplated metal.

In an exemplary embodiment, the strike coat is copper and the lines electrodeposited onto the strike coat are also copper. The etchant used to remove the strike coat is an aqueous solution of ammonium persulfate, e.g., 5 grams of ammonium persulfate per liter of solution. The etch is continued until the lines are of a required width when measured, for example, by means of a microscope. Line widths of about 0.2 to about 2.0 mils are preferable because they are virtually undetectable by the naked eye. Line widths of about 0.2 to 0.7 mils are preferred.

When a tie-coat is used in addition to the strike coat, the etch solution removes those portions of both the tie-coat and strike coats onto which no metal was electrodeposited. In an embodiment where a tie-coat is used, the metal film runs comprise the electroplated metal, the portion of the metal strike coat beneath the electroplated metal, and the portion of the tie-coat beneath the strike coat.

The etching step is identified by numeral 49 of FIG. 10 and is followed by a rinsing step in de-ionized water as is identified by the numeral 50.

A feature of the present invention when copper is used for forming the electroconductive metal film run is blackening the rinsed copper by dipping or rinsing the substrate in a 0.5% aqueous solution of sodium sulfide. Such a blackening coating reduces glare and also reduces undesired reflection through the windshield or window. The copper blackening step is identified by the numeral 51 which is followed by a rinsing step 52 in de-ionized water. Next, the metal braid for the bus bar is applied across the attachment elements by employing a braid cement or adhesive such as silver epoxy resin and the silver resin is cured for 1-2 hours at 200° F. or 24 hours at room temperature, for example. The application of the braid is indicated by the numeral 53 and the curing step is indicated by the numeral 54. At this time, the substrate onto which the electroconductive lines have been formed is ready to be laminated into the complete window structure. Thus, a major surface of a transparent material selected as the second layer of the window is bonded to the inner surface of the first layer to thereby sandwich the spaced apart electroconductive metal film runs between the layers. As was mentioned previously, the second layer is preferably a plastic selected from the group consisting of urethane, silicone or polyvinyl butyral. If desired, a third or inner layer, for example, of a rigid glass or plastic can be bonded to the inter layer to comprise the laminate. If desired, additional layers may be provided.

To further clarify the method or process provided in accordance with this invention for fabricating the laminated heated window 10, reference is now made to FIGS. 11-14 inclusive which illustrate the steps of an exemplary embodiment of the process in a structural form. Turning first to FIG. 11, the major surface of the outer layer or substrate 11 onto which electroconductive lines are to be formed is identified by the numeral 55. A basecoat 30, as described above, is on the surface 55 of the substrate. (As described previously, the identity of the basecoat depends on whether the substrate 11 is glass or acrylic.) Next, the copper strike coat layer is indicated by the numeral 56 and a photoresist coating 57 is on the strike coat.

Although no tie-coat is provided in the embodiment illustrated in FIGS. 11-14, if desired, and as described above, a tie-coat can be provided. A photo mask 58, which includes a selected pattern of the metal film runs intended to be applied to the strike coat, is shown extending over the substrate surface. The pattern is indicated by numerals 59 and 60 as examples of openings exposing photoresist covered copper therebeneath. The process steps associated with FIG. 11 are those indicated by the numerals 40-45 of FIG. 10.

The FIG. 12, copper has been electroplated onto the copper strike coat or layer 56 and the photo mask 58 has been removed. It is noted that after the electroplating step the runs of thin film copper strips, such as the strips 16 and 17, are raised above the surface of the strike copper and that the tops of each of the runs are slightly rounded. It should be understood that the drawings of FIGS. 11-14 are not to scale and the copper strike coat is actually very much thinner than the height of the copper lines electrodeposited thereon. The process steps associated with FIG. 12 are those identified by numerals 46-48 of FIG. 10.

As is shown in FIG. 13, the substrate is then etched by the procedure described above to remove the strike copper and to precisely adjust a width of the thin film runs or strips to the desired dimension. During the etching process, both the height and width of the respective thin film runs are adjusted. A graph, such as that shown in FIG. 15, can be provided to relate the width and thickness of such a metal film line as a function of etching time. The line 61, for example, pertains to width of such a metal film run while the line 62 pertains to its height or thickness. Preferably the height of each such film run is from about 0.1 to about 0.4 mils. FIG. 13 shows the layer 11 with basecoat 30 and the copper thin film runs thereon after the strike copper is removed and the tops of the runs flattened by etching. The process steps associated with FIG. 13 are those identified by numerals 49-50 of FIG. 10.

In FIG. 14, the substrate comprising the outer layer 11 and basecoat 30, including the electroconductive pattern comprising the plurality of fully formed electroconductive metal film runs 16 and 17, is shown after the substrate is dipped and rinsed according to steps 51 and 52. Thus, a blackened coating 63 is on the previously exposed copper surfaces of the runs.

Turning to FIG. 16, another exemplary embodiment of practice of principles of this invention is shown wherein a tie-coat, as is described above, is provided. The major surface of the outer layer or substrate 111 onto which electroconductive lines are to be formed is identified by the numeral 155. A transparent basecoat 130, as described above, is on the surface 155 of the substrate. (As described previously, the identity of the basecoat depends on whether the substrate 111 is glass or acrylic). Next, a tie-coat identified by the numeral 158 is on the basecoat and a copper strike coat, identified by the numeral 156, is on the tie-coat. A photoresist coating 157 is on the strike coat. A procedure similar to that described above with regard to FIGS. 11-15 for forming the laminated heated window 10 is provided, with the exception that since a tie-coat is used in addition to a strike coat, the tie-coat and strike coat are both etched. As is mentioned above, in this embodiment, which includes a tie-coat, the metal film runs comprise the electroplated metal, the portion of the strike coat beneath the electroplated metal and the portion of the tie-coat beneath the strike coat.

A key feature of the process of this invention is that the electroconductive metal film runs adhere vigorously to the surface of the substrate and thus, no hot spots and attendant visual distortion results. This feature is provided by means of using the perferred basecoats described above and also, if desired, by using the above-described tie-coat.

Since the electroconductive lines or runs 16 and 17 of metal film are provided by electroplating them onto a surface to be heated, their efficiency is far superior to the efficiency of wires which have only tangential contact with such a surface. Furthermore, as is mentioned above, using metal film runs does not cause the visual distortion that results from the use of wires.

The above description of preferred embodiments of a process for producing a heatable window that includes forming a plurality of spaced apart electroconductive metal film runs on an inner major surface of the first or outer layer of such a window is for illustrative purposes. Because of variations which will be apparent to those skilled in the art, the present invention is not intended to be limited to the particular embodiments described above. The scope of the invention is defined in the following claims.

What is claimed is:

1. A composite transparency comprising:
   (a) an outer layer of rigid, transparent, electrically-insulating material having an inner major surface;
   (b) a transparent electrically-insulating basecoat on the inner major surface of the outer layer and secured thereto;
   (c) a plurality of spaced-apart electroconductive metal film runs comprising a strike coat portion vacuum deposited in adhering relationship onto the basecoat and an electroplated portion electrodeposited onto the strike coat portion; and
   (d) a transparent interlayer of relatively flexible electrically-insulating plastic bonded to the transparent basecoat on the inner major surface of the outer layer to thereby sandwich the spaced-apart electroconductive metal film runs between the basecoat and the interlayer.

2. A composite transparency comprising:
   (a) an outer layer of rigid, transparent, electrically-insulating material having an inner major surface;
   (b) a transparent electricallly-insulating basecoat on the inner major surface of the outer layer and secured thereto;
   (c) a plurality of spaced-apart electroconductive metal film runs adhered to the basecoat; and
   (d) a transparent interlayer of relatively flexible electrically-insulating plastic bonded to the transparent basecoat on the inner major surface of the outer layer to thereby sandwich the spaced-apart electroconductive metal film runs between the basecoat and the interlayer, wherein the outer layer is acrylic and the basecoat comprises a copolymer reaction product of a methacrylic acid ester and an organofunctional silane, wherein the organofunctional silane has the general formula R-Si (OR')$_3$ wherein R comprises an acrylic containing organofunctional group and R' is an alkyl group.

3. The composite transparency as claimed in claim 2 wherein the basecoat comprises a copolymer reaction product of methylmethacrylate and methacryloxypropyltrimethoxy silane.

4. The composite transparency as claimed in claim 2 wherein the electroconductive metal film runs comprise copper.

5. A composite transparency comprising:
   (a) an outer layer of rigid, transparent, electrically-insulating material having an inner major surface;
   (b) a transparent electrically-insulating basecoat on the inner major surface of the outer layer and secured thereto;
   (c) a plurality of spaced-apart electroconductive metal film runs adhered to the basecoat wherein said film runs comprise a layered structure that includes a thin layer of nickel and chromium provided as a portion of a tie-coat vacuum deposited on the basecoat, a thin layer of copper on the nickel/chromium layer provided as a portion of a strike coat vacuum deposited on the tie-coat, and a layer of copper electrodeposited onto the strike coat in the pattern of the electroconductive film runs; and
   (d) a transparent interlayer of relatively flexible electrically-insulating plastic bonded to the transparent basecoat on the inner major surface of the outer layer to thereby sandwich the spaced-apart electroconductive metal film runs between the basecoat and the interlayer.

6. The composite transparency as claimed in claim 5 wherein the nickel/chromium layer comprises about 80% nickel and 20% chromium.

7. The composite transparency as claimed in claim 5 additionally comprising electrical connection means including:
   (a) An attachment element integral with and forming the termination of each of the electroconductive metal film runs;
   (b) bus strips means mechanically and electrically connected to the attachment elements; and
   (c) terminal leads connected to the bus strip means.

* * * * *